United States Patent [19]

Kimura et al.

[11] Patent Number: 5,012,310
[45] Date of Patent: Apr. 30, 1991

[54] SEMICONDUCTOR MEMORY HAVING STACKED CAPACITOR

[75] Inventors: Shinichiro Kimura, Hachioji; Yoshifumi Kawamoto, Kanagawa; Toru Kaga, Urawa; Hideo Sunami, Tokyo, all of Japan

[73] Assignee: Hitachi, Ltd., Tokyo, Japan

[21] Appl. No.: 566,315

[22] Filed: Aug. 13, 1990

Related U.S. Application Data

[63] Continuation of Ser. No. 133,475, Dec. 15, 1987, abandoned.

[30] Foreign Application Priority Data

Feb. 6, 1987 [JP] Japan .................. 62-24529

[51] Int. Cl.$^5$ .................. H01L 29/68; H01L 27/02; H01L 23/48
[52] U.S. Cl. .................. 357/23.6; 357/41; 357/49; 357/51; 357/54; 357/59; 357/71
[58] Field of Search .................. 357/23.6, 51, 41, 49, 357/54, 59 J, 59 K, 71 P, 71

[56] References Cited

U.S. PATENT DOCUMENTS

| 4,455,568 | 6/1984 | Shiota | 357/54 |
| 4,700,457 | 10/1987 | Matsukawa | 357/23.6 |
| 4,742,018 | 5/1988 | Kimura et al. | 357/23.6 |
| 4,754,313 | 6/1988 | Takemae et al. | 357/41 |
| 4,760,034 | 7/1988 | Barden | 357/23.6 |
| 4,855,801 | 8/1989 | Kuesters | 357/23.5 |

OTHER PUBLICATIONS

Ohta, K. et al., "Quadruply Self Aligned . . . ", IEEE Trans., Electron Dev., vol. ED-29, No. 3, Mar. 1982, pp. 368-376.
L. Glasser, D. Dobberpuhl, "The Design & Analysis of VLSI Circuits", 1985, p. 398.

Primary Examiner—Andrew J. James
Assistant Examiner—Ngan Van Ngo
Attorney, Agent, or Firm—Antonelli, Terry, Stout & Kraus

[57] ABSTRACT

A megabit dynamic random access memory realizing high integration and high reliability is disclosed. The need for an allowance for photomask alignment which is carried out to produce a stacked capacitor memory cell is eliminated. The plate electrode of each memory cell is isolated from the corresponding data line in a memory array by means of an insulating film which is self-alignedly provided around the plate electrode.

20 Claims, 4 Drawing Sheets

SEMICONDUCTOR MEMORY HAVING STACKED CAPACITOR

This application is a Continuation application of application Ser. No. 07/133,475, filed Dec. 15, 1987 now abandoned.

BACKGROUND OF THE INVENTION

The present invention relates to a charge storage capacitor for use in a dRAM (dynamic random access memory) which is small and yet has a large capacity as well as to a method for producing the same.

There has been realized a four-fold increase in the integration density of dRAMs in three years. The mainstream products have already been expanded from 64 k-bit dRAMs to 256 k-bit dRAMs, and mass production of 1 mega-bit dRAMs has already been started. The high integration has been attained by realization of reduction in the cell size which is known as "scaling rule". However, as a result of the reduction in the individual memory cell size, the storage capacity associated therewith also decreases, and this gives rise to serious problems such as a lowering in the S/N ratio and charge depletion due to alpha particles, which results in degradation of the reliability. In these circumstances, the following novel capacitor cells have been proposed with a view to increasing the storage capacity and are expected to replace the conventional planar capacitors, that is, a trench capacitor cell that utilizes the side walls of a trench provided in a substrate and a stacked capacitor cell in which the capacitance portion is defined by a stacked capacitor, the stacked capacitor cell being discussed in the literature titled "Novel high density, Stacked capacitor MOS RAM" in IEEE Int, Electron Devices Meeting Tech, Dig., pp.348-351, Dec. (1978) by Koyanagi, Sumami, Hashimoto and Ashikawa. Among the novel capacitors, the latter, i.e., the stacked capacitor, has attracted attention as being a capacitor which is capable of coping with future demands for smaller devices, since, unlike the trench capacitor, the stacked capacitor needs no high degree of technique to provide a minute trench in a substrate.

Referring to FIG. 1, which is a sectional view of a dRAM having a conventional stacked capacitor, a process for producing the dRAM will be briefly explained below.

First, an oxide film 32 is grown on the surface of a single crystal substrate 31 to isolate elements from each other. Then, an oxide film 33 which is to define a gate oxide of a transistor is grown. A polycrystalline silicon 34 which contains an impurity is deposited to form a gate electrode. After the polycrystalline silicon 34 has been processed, a source 35 and a drain 36 are formed self-alignedly by ion implantation or other similar means. Next, in order to form a charge storage capacitor portion, a polycrystalline silicon 38 which contains an impurity is deposited on a region over the drain 36 as shown in FIG. 1. At this time, the polycrystalline silicon 38 is formed such as to extend over the gate electrode 34 and the field oxide 32 and therefore it is possible to increase the area of the capacitor in comparison with the conventional planar capacitor structure that utilizes only the plane of the substrate. It should be noted that the gate electrode 34 is covered with an insulating film 37 such as an oxide film. An oxide film 39 is formed over the polycrystalline silicon 38 formed as described above to define a dielectric film of the capacitor. A conductor 310 is deposited over the oxide film 39 to complete the capacitor. Further, an interlayer insulating film 311 is deposited over the conductor 310, and after a contact hole 312 has been opened in the insulating film 311 so that the source region 35 of the transistor is exposed, a conductor layer 313 which is to define a data line is formed.

Thus, the dRAM cell having a stacked capacitor has the advantage that it is possible to increase the storage capacity as compared with a planar dRAM cell in which a capacitor is formed only on the plane of the substrate.

However, the present inventors have found that the above-described stacked capacitor cell has the structural problem that, as the device becomes smaller, the capacitor capacity decreases, and it is therefore impossible to reduce the size of the device to a substantial extent, that is, it is impossible to form a memory circuit with a high integration density. This problem is attributable to the fact that, when the contact hole 312 is to be formed, it is necessary to take into consideration an alignment tolerance for etching between the contact hole 312 and the gate electrode 34 or the plate electrode 310 in order to prevent these electrodes from being partially exposed. Moreover, the conventional stacked capacitor cell needs to have a considerably large alignment tolerance for masks used to form the contact hole 312 and the gate electrode 34 or the plate electrode 310. This is because the mask used for the formation of the contact hole 312 which is carried out close to the end of the process needs to have a large tolerance in view of a worst case situation of a misalignment of the patterns which have already been exposed. More specifically, in the case of a mask which is only required to be aligned with a layer directly below it, it suffices to have an alignment tolerance which is needed in a single photoresist step, whereas, in the case of the contact portion of the stacked capacitor cell, it is necessary not only to align the mask with the diffusion layer under the layer which is to be etched, but also to have an alignment tolerance with respect to the gate electrode 34 or the plate 310 which may cause a short circuit if the mask should be misaligned. Accordingly, it is necessary to have an alignment tolerance corresponding to the sum of alignment tolerances which are required in a plurality of steps from the photoresist step for the diffusion layer to the photoresist step for the gate electrode or plate electrode. Moreover, it is also necessary to have an alignment tolerance in order to enable the plate electrode 310 to cover the lower electrode 38 completely. Thus, it is necessary to have large alignment tolerances for the two portions, and this limits the area of the lower electrode 38 of the capacitor, resulting in a reduction in the storage capacity.

SUMMARY OF THE INVENTION

The present invention provides a semiconductor memory having a stacked capacitor which has a structure that enables a contact for a data line to be provided without the need to have a mask alignment tolerance which has heretofore been required.

According to the present invention, an insulating film is self-alignedly provided on the side wall portion of an upper electrode, i.e., a plate electrode, of a semiconductor memory having a stacked capacitor to isolate the plate electrode from the corresponding data line by this insulating film.

The above-described structure in which the plate electrode is covered with the insulating film in a self-aligned manner can be effectively attained by providing an insulating film which covers the upper surface of the plate electrode and an insulating film which covers the side wall portion of the plate electrode.

It is an object of the present invention to provide a semiconductor memory of high integration.

It is another object of the present invention to provide a considerably small semiconductor memory cell.

It is still another object of the present invention to provide a semiconductor memory cell of high reliability.

It is a further object of the present invention to provide a semiconductor memory cell which is so designed that there is no fear of shorting between a plate electrode and the corresponding data line.

It is a still further object of the present invention to provide a readily producible semiconductor memory cell.

It is a still further object of the present invention to provide a semiconductor memory which is so designed that it is possible to increase the area of each capacitor even when the size of the device is reduced, by eliminating the need for mask alignment for the contact hole and the gate electrode or the plate electrode which has heretofore required the largest alignment tolerance, while employing a conductive layer stacked on the upper side of a switching transistor as one electrode of the capacitor in the same way as in the conventional stacked capacitor cell, for example, employed in dynamic RAMS.

These and other objects and many of the attendant advantages of this invention will be readily appreciated as the same becomes better understood by reference to the following detailed description when considered in connection with the accompanying drawings.

DETAILED DESCRIPTION OF THE INVENTION

Figure 2:
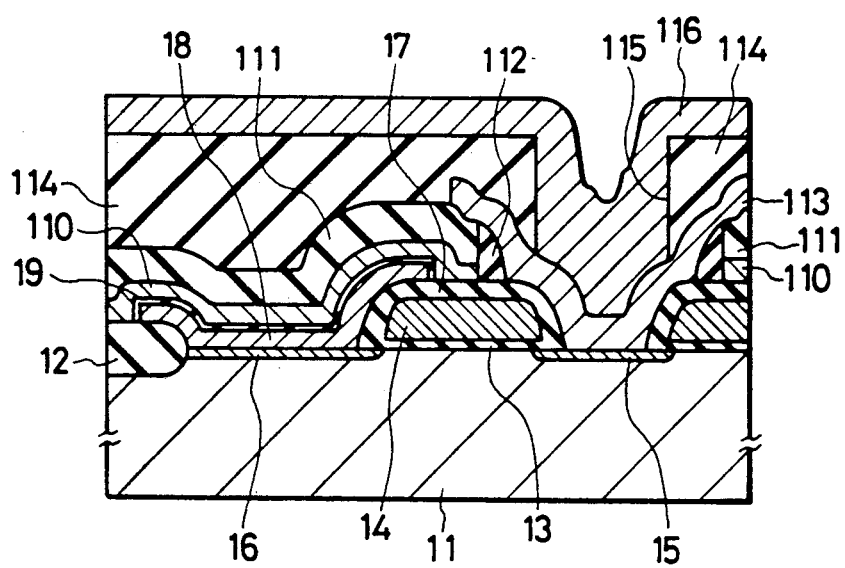
FIG. 2 is a sectional view of a first embodiment of the present invention.

The present invention will be described hereinunder with reference to the accompanying drawings. FIG. 2 is a sectional view of the semiconductor memory according to the present invention. According to the present invention, the following structure is adopted in order to eliminate the need for the alignment tolerance which has heretofore been required for the contact hole (denoted by the reference numeral 115 in FIG. 2) and the plate electrode (denoted by the numeral 110 in FIG. 2) in the conventional stacked capacitor cell. Namely, interlayer insulating films 111 and 112 which cover, in combination, the plate electrode 110 so as to electrically isolate the plate electrode 110 from a data line 116 are formed self-alignedly without the need for any mask. As a result, it becomes unnecessary to have an alignment tolerance between the plate electrode and the contact hole, and it is therefore possible to increase the area of the lower electrode 18 of the storage capacitor and hence attain an increase in the storage capacity.

In the semiconductor memory according to the present invention shown in FIG. 2, after the interlayer insulating films 111 and 112 have been self-alignedly formed so as to cover the plate electrode 110, a conductive layer 113 is formed for realizing ohmic contact with a diffusion layer 15 formed in the surface region of a substrate 11, and the contact hole 115 is then opened. The term "self alignment" herein means that the positions of the insulating films 111 and 112 can be controlled in accordance with manufacturing conditions such as the thickness of the films and the etching time independently of the photomask alignment. The above-described structure enables not only the formation of a contact hole in each memory cell but also simultaneous formation of contact holes in various other conductive layers, for example, a diffusion layer of a circuit other than the memory cell, the gate electrode 14 and the plate electrode 110, which is considerably advantageous from the view point of wiring for the data line 116 and the like which is carried out later. However, it is, of course, possible to directly employ the conductive layer 113 for wiring.

It should be noted that, in FIG. 2, the reference numeral 11 denotes a single crystal substrate, 12 a field oxide, 13 a gate oxide, 14 a gate electrode of a corresponding insulated gate field effect transistor (IGFET) switch which gate electrode is made of polycrystalline silicon, a refractory metal such as tungsten or tantalum, or a silicide of such a refractory metal, 15, 16 are diffusion layers corresponding to drain and source regions of the IGFET, 17 an oxide film covering the gate electrode, 18 a lower electrode of a charge storage capacitor, 19 a capacitor dielectric film defined by an oxide film, a nitride film, or a composite film consisting of oxide and nitride films, 110 a plate electrode, 111 an interlayer insulating film covering the upper surface of the plate electrode, 112 an interlayer insulating film or side wall film covering the side surface of the plate electrode, 113 a conductive layer, e.g., polycrystalline silicon, for connecting together the diffusion layer 15 and the data line 116, 115 a contact hole opened in the interlayer insulating layer 114, and 116 a data line made of a metal such as aluminum or the like, polycrystalline silicon, a refractory metal such as tungsten or tantalum, or a silicide of such a refractory metal.

Figure 1:
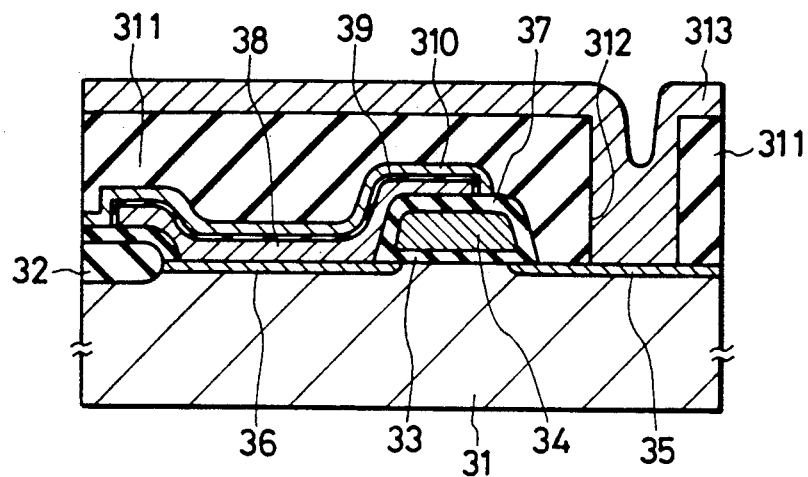
FIG. 1 is a sectional view of a conventional semiconductor memory dRAM having a stacked capacitor.

In the semiconductor memory shown in FIG. 2, the interlayer insulating films 111 and 112 which cover in combination the plate electrode 110 are self-alignedly formed and, at this time, the diffusion layer 15 in the surface region of the substrate 11 is exposed. Therefore, it is unnecessary to open a contact hole for exposing the diffusion layer by carrying out an etching step which has heretofore been required in the conventional semiconductor memory shown in FIG. 1. Accordingly, there is no need for an alignment tolerance for the contact hole and the plate electrode, so that it is possible to increase the area of the capacitor and hence increase the storage capacity.

One embodiment for realizing the semiconductor memory according to the present invention will next be described with reference to FIG. 3.

Figure 3A:
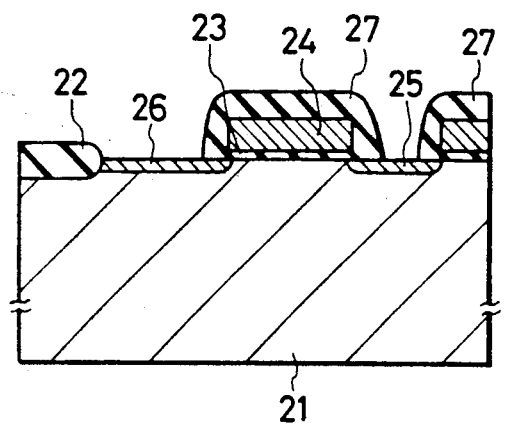
FIGS. 3A to 3G are sectional views showing a second embodiment of the present invention.

Referring first to FIG. 3A, a relatively thick oxide film 22 for electrically isolating elements from each other is grown on a semiconductor single crystal substrate 21 by LOCOS (local oxidation of silicon) or other similar means. The film thickness is preferably 500 nm or more. Next, a gate oxide 23 is grown by thermal oxidation, and a low-resistivity polycrystalline silicon 24 which is to define a gate electrode is deposited and then processed. After the gate electrode 24 has been covered with an interlayer dielectric film 27, diffusion layers 25 and 26 which are different from the substrate 21 in terms of the type of conductivity are formed in self-alignment with the gate electrode 24 by ion implantation. Thereafter, a heat treatment is applied in order to activate the implanted impurity. In this embodiment, the heat treatment is carried out for 10 minutes at 950° C. Although the diffusion layers 25 and 26 shown in FIG. 3A are formed from only one kind of impurity for the purpose of simplifying the illustration, it is also possible to adopt a known diffusion layer structure which is designed to reduce the electric field intensity. For example, it is possible to employ the LDD (Lightly Doped Drain) or DDD (Double Diffused Drain) structure.

Figure 3B:
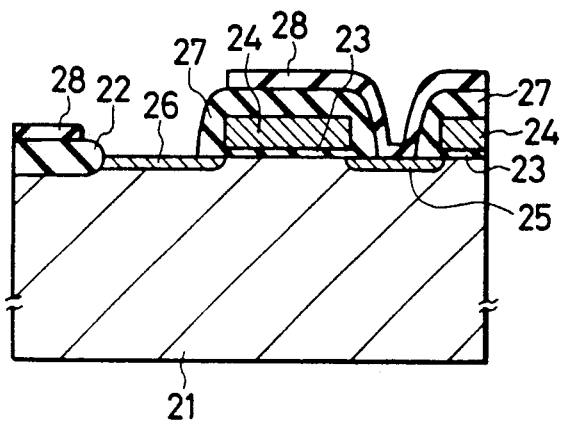
Figure 3C:
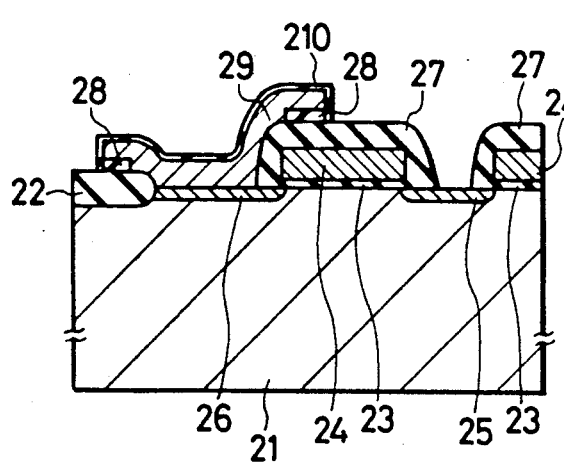

Referring next to FIG. 3B, the whole surface is covered with an oxide film 28, and then the oxide film 28 on one diffusion layer 26 alone is removed by photolithography and dry-etching. The oxide film 28 functions as a ground when a lower electrode 29 of the capacitor is processed and serves to prevent other elements from being damaged, as shown in FIG. 3C. As a material for the lower electrode of the capacitor, a low-resistivity polycrystalline silicon 29 which has the same conductivity type as that of the diffusion layers 25 and 26 is employed. A capacitor dielectric film 210 is formed over the surface of the polycrystalline silicon 29. It is possible to employ as the capacitor dielectric film a $SiO_2$ film formed by oxidizing the polycrystalline silicon 29 by thermal oxidation, or a multilayer film of $SiO_2$ and $Si_3N_4$, or a high dielectric-constant film such as a tantalum pentaoxide film.

Figure 3D:
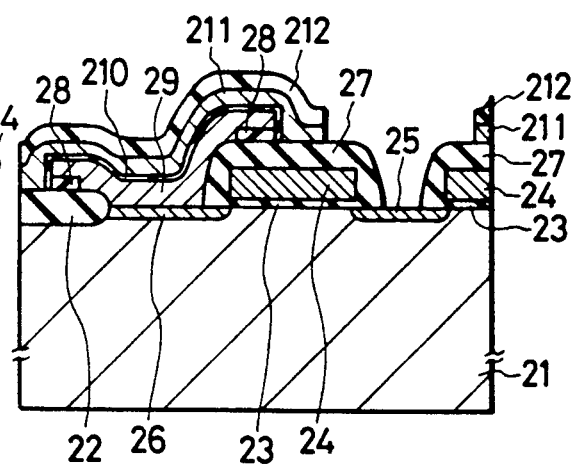
Figure 3E:
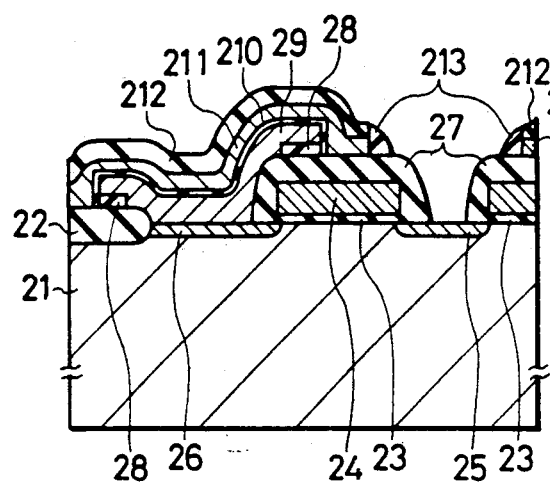

Referring next to FIG. 3D, a plate electrode 211 is deposited so as to cover the whole of the capacitor dielectric film 210 and is then etched so that a desired portion alone is left. As a material for the plate electrode 211, it is possible to employ a low-resistivity polycrystalline silicon, a refractory metal such as tungsten, or a silicide of such a refractory metal. In the semiconductor memory according to the present invention, when the plate electrode 211 is processed, the interlayer insulating film 212 deposited on the plate electrode 211 is processed simultaneously. Thereafter, an interlayer insulating film 213 is deposited again and the whole surface is subjected to anisotropic etching by dry-etching or the like. As a result, as shown in FIG. 3E, the side wall insulating film 213 is left on the respective side surfaces of the plate electrode 211 and the interlayer insulating film 212 thereon and the plate electrode 211 is thus completely covered with these films 212 and 213. This step needs no mask for etching.

Figure 3F:
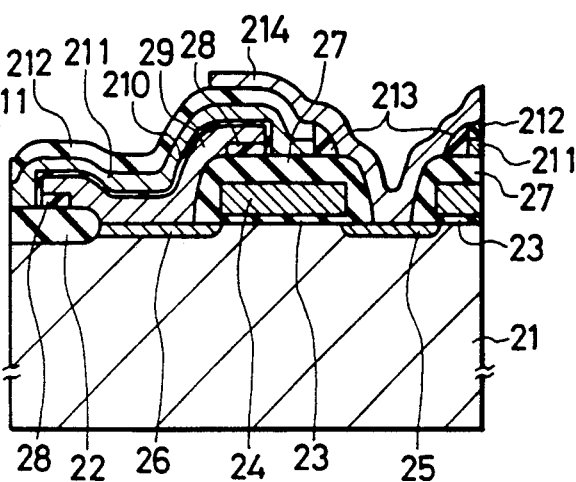

A conductive layer 214 realizing ohmic contact with the one diffusion layer exposed is formed over the resulting structure and then etched so that a necessary portion alone is left, as shown in FIG. 3F. This conductive layer 214 is formed using a low-resistivity polycrystalline silicon. Polycrystalline silicon is formed by chemical vapor deposition and has good step coverage characteristics; therefore, it is suitable for such a portion having a large number of steep steps.

Figure 3G:
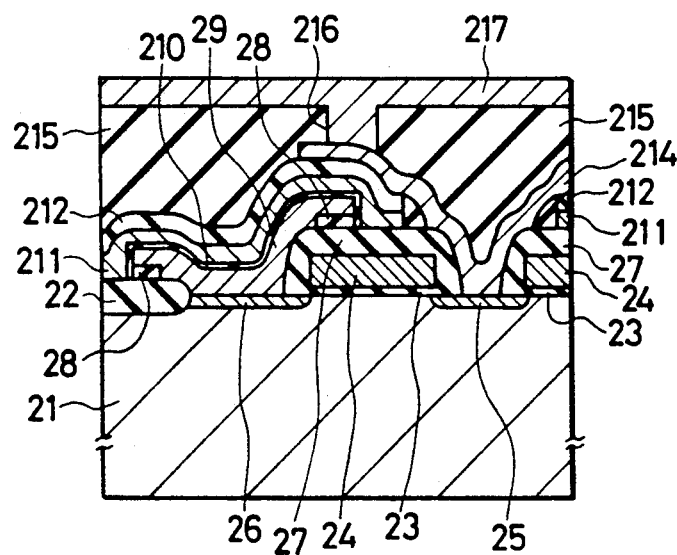

Finally, as shown in FIG. 3G, an interlayer insulating film 215 is deposited and then flattened. Thereafter, a contact hole 216 is opened in the film 215, and a low-resistivity metal wiring such as Aλ wiring is formed to define a data line 217, thus completing the semiconductor memory according to the present invention.

Figure 4:
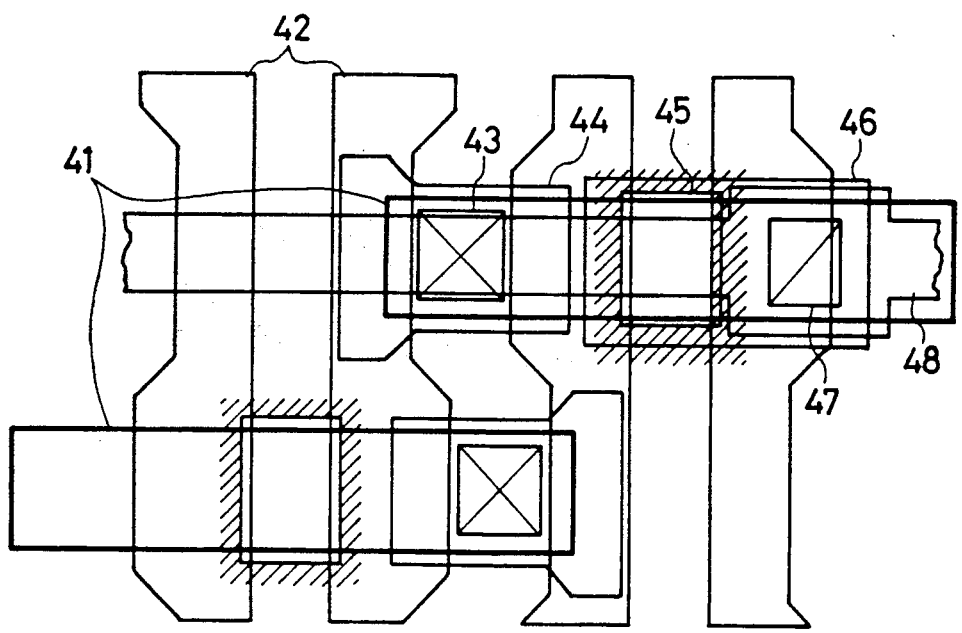
FIG. 4 is a plan view of the first embodiment of the present invention.
Figure 5:
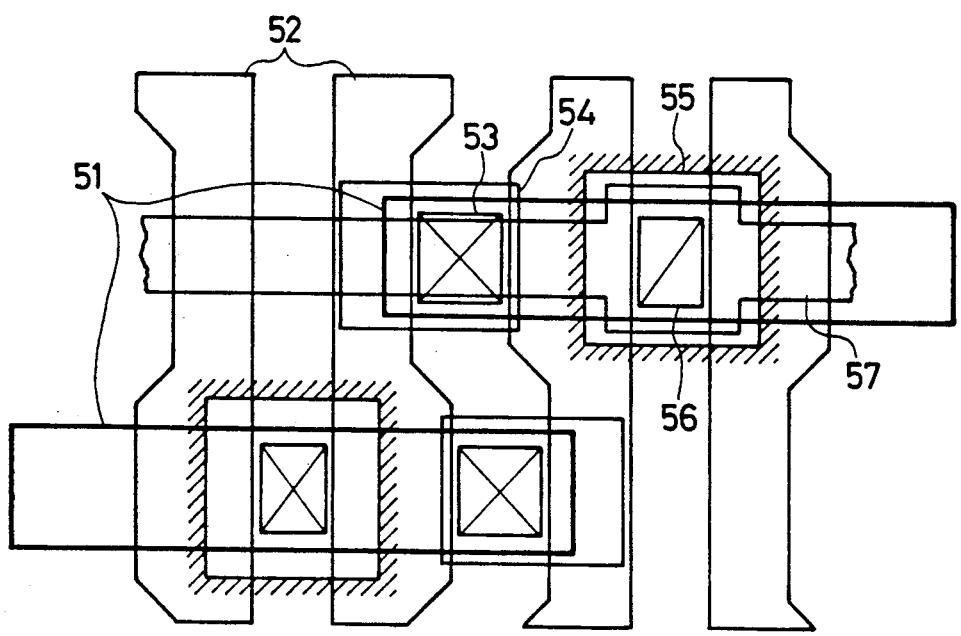
FIG. 5 is a plan view of a conventional semiconductor memory having a stacked capacitor.

FIG. 4 schematically shows the layout of semiconductor memory having a stacked capacitor according to the present invention, while FIG. 5 schematically shows the layout of a conventional semiconductor memory having a stacked capacitor. Although the semiconductor memories shown in FIGS. 4 and 5 have folded-bit cells, the present invention may also be applied to other semiconductor memories as with respect to those which employ openbit cells. It should be noted that the alignment tolerance, the width of the lines and the spaces are the same in the two layouts.

In the semiconductor memory according to the present invention shown in FIG. 4, covering of the plate electrode 45 with the insulating films can be effected self-alignedly and it is therefore unnecessary to have any alignment tolerance between the plate electrode 45 and the contact hole 47. Accordingly, it is only necessary to employ such a mask for processing the plate electrode 45 where the diffusion layer in the substrate is exposed. Thus, it is possible to increase the area of the polycrystalline silicon which defines the lower electrode 44 of the capacitor.

The plate electrode 45 is formed so as to extend all over the memory mat, and the square portion denoted by the reference numeral 45 is opening.

On the other hand, the conventional structure shown in FIG. 5 indispensably needs to have an alignment tolerance between the contact hole 56 and the plate electrode 55, and therefore the opening in the plate electrode 55 is increased, which results in a reduction in the area of the lower electrode 54 of the capacitor. It has been experimentally confirmed that, for the same cell area per bit, the structure according to the present invention has a storage capacity which is about 50% larger than that of the convention structure.

Since it is unnecessary according to the present invention to align the contact hole 47 with the plate electrode 45, the contact hole 47 may be opened at any position as long as the conductive layer 46 is employed as shown in FIG. 4. Accordingly, it is unnecessary to provide a contact hole in the valley portion defined between each pair of adjacent word lines 42 as in the case of the conventional structure shown in FIG. 5, and therefore it is possible to realize a wiring structure of excellent reliability.

As has been described above, employment of the semiconductor memory according to the present invention enables formation of a memory circuit which has a large storage capacity and excellent reliability as compared with the conventional structure.

It should be noted that, in FIGS. 4 and 5, the reference numerals 41 and 51 denote field oxides, 42, 52 gate electrodes, 43, 53 contact holes for enabling the lower electrode of each capacitor alone to be brought into contact with the diffusion layer in the substrate, 44, 54 lower electrodes of capacitors, 45, 55 plate electrodes, 46 a conductive layer, 47, 56 contact holes, and 48, 57 data lines.

It is further understood by those skilled in the art that the foregoing description is a preferred embodiment of the disclosed device and that various changes and modifications may be made in the invention without departing from the spirit and scope thereof.

What is claimed is:

1. A semiconductor memory comprising:

a semiconductor substrate;

a plurality of word lines;

a plurality of data lines intersecting said word lines;

an insulated gate field effect transistor connected at a gate electrode thereof to a respective one of said word lines and at one of a source and a drain region thereof is connected to one of the data lines intersecting said word line; and a capacitor connected at a first electrode thereof to the other one of said source and drain regions of said insulated gate field effect transistor, said capacitor having a first insulating film interposed between said first electrode and a second electrode thereof to form a capacitance, the second electrode of said capacitor being defined by a conductive layer provided on said semiconductor substrate, said conductive layer having an upper surface which has formed thereon a second insulating film and has a side wall which has formed thereon a third insulating film, said second and third insulation films being interposed between said conductive layer and said data line, wherein said data line and said one of the source and drain regions are connected together through a contact hole in an interlayer insulating film which interlayer insulating film is interposed between said second and third insulating films and said data line, said contact hole being disposed above said gate electrode, and wherein the second electrode of said capacitor is insulated from and extends over the gate electrode.

2. A semiconductor memory according to claim 1, wherein said gate electrode is made of a polycrystalline silicon, a refractory metal, or a silicide of a refractory metal.

3. A semiconductor memory according to claim 1, wherein a polycrystalline silicon conductive layer is provided so as to electrically interconnect said data line and said one of said source and drain regions of said insulated gate field effect transistor.

4. A semiconductor memory according to claim 1, wherein said first insulating film is a composite layer of at least a silicon oxide film and a silicon nitride film.

5. A semiconductor memory according to claim 1, wherein said memory constitutes a folded bit line structure.

6. A semiconductor memory according to claim 1, further comprising:

a polycrystalline silicon conductive layer interposed between said one of the source and drain regions of said insulated gate field effect transistor and said data line associated therewith.

7. A semiconductor memory according to claim 6, wherein said contact hole is formed above said one of the source and drain regions thereby electrically connecting said data line and said one of the source and drain regions via said polycrystalline silicon conductive layer.

8. A semiconductor memory according to claim 2, wherein a polycrystalline silicon conductive layer is provided so as to electrically interconnect said data line and said one of said source and drain regions of said insulated gate field effect transistor.

9. A semiconductor memory according to claim 8, wherein said first insulating film has at least a silicon oxide film and a silicon nitride film.

10. A semiconductor memory according to claim 9, wherein said memory constitutes a folded bit line structure.

11. A semiconductor memory according to claim 2, wherein said first insulating film has at least a silicon oxide film and a silicon nitride film 12. A semiconductor memory according to claim 11, wherein said memory constitutes a folded bit line structure.

13. A semiconductor memory according to claim 2, wherein said memory constitutes a folded bit line structure.

14. A semiconductor memory according to claim 2, further comprising:

a polycrystalline silicon conductive layer interposed between said one of the source and drain regions of said insulated gate field effect transistor and said data line associated therewith.

15. A semiconductor memory according to claim 14, wherein said contact hole is formed above said one of the source and drain regions thereby electrically connecting said data line and said one of the source and drain regions via said polycrystalline silicon conductive layer.

16. A semiconductor memory according to claim 3, wherein said first insulating film has at least a silicon oxide film and a silicon nitride film.

17. A semiconductor memory according to claim 3, wherein said memory constitutes a folded bit line structure.

18. A semiconductor memory according to claim 4, wherein said memory constitutes a folded bit line structure.

19. A semiconductor memory according to claim 4, further comprising:

a polycrystalline silicon conductive layer interposed between said one of the source and drain regions of said insulated gate field effect transistor and said data line associated therewith.

20. A semiconductor memory according to claim 19, wherein said contact hole is formed above said one of the source and drain regions thereby electrically connecting said data line and said one of the source and drain regions via said polycrystalline silicon conductive layer.

* * * * *